United States Patent

[11] 3,550,681

[72] Inventors Paul G. Stier
Muskego;
Gust N. Scaboo, New Berlin, Wis.
[21] Appl. No. 787,782
[22] Filed Dec. 30, 1968
[45] Patented Dec. 29, 1970
[73] Assignee General Motors Corporation
Detroit, Mich.
a corporation of Delaware

[54] SELF-ADJUSTING THERMAL CONNECTOR
7 Claims, 4 Drawing Figs.

[52] U.S. Cl. .......... 165/80, 161/186
[51] Int. Cl. .......... F28f 7/00
[50] Field of Search .......... 165/185, 186, 80, 47

[56] References Cited
UNITED STATES PATENTS
3,212,568 10/1965 Frawley ...... 165/80

*Primary Examiner*—Charles Sukalo
*Attorneys*—Jean L. Carpenter, Paul Fitzpatrick and Warren D. Hill

ABSTRACT: An adjustable thermal connection between a printed circuit board and a heat exchanger includes a T-shaped thermal connector having a slotted leg adjustably held in thermal contact with the circuit board by rivets passing through the slots. The head of the T-shaped thermal connector seats within a channel in the wall of the heat exchanger. A spring clip urges the head of the thermal connector against the heat exchanger wall while allowing slidable adjustment of the connector relative to the wall, both laterally and longitudinally.

PATENTED DEC 29 1970 3,550,681

INVENTORS
Paul G. Stier, &
BY Gust N. Scaboo

Warren D. Hill
ATTORNEY

SELF-ADJUSTING THERMAL CONNECTOR

This invention relates to an adjustable thermal connector and especially to an adjustable thermal connector for connecting a printed circuit board to a heat exchanger or other heat sink.

It is often desired to arrange a series of printed circuit boards in a cabinet and when the circuit boards carry heat dissipating components, it is necessary to conduct the heat from a circuit board to a heat exchanger within the cabinet or forming a part of the cabinet wall. Ordinarily, it is desirable to slide the circuit boards into the cabinet to plug into electrical connectors within the cabinet. Where the circuit board contains a large number of small terminals, each to be connected with a contact in the electrical connector, the circuit board must be precisely located within the cabinet. Heretofore it has been difficult, partially due to manufacturing tolerances, to plug in a circuit board to make proper connection with the connector and at the same time, to make good thermal contact with the heat exchanger.

It is therefore an object of this invention to provide an adjustable arrangement for conducting heat from a device carrying heat generating components to a heat sink.

It is another object of this invention to provide a self-adjusting arrangement for thermally connecting a circuit board with a heat sink.

It is a further object of this invention to provide a self-adjusting heat conducting connection between a circuit board and a heat sink disposed at right angles thereto.

It is yet another object of this invention to provide a heat conducting connection between a circuit board and a heat sink which allows manipulation of the circuit board relative to the heat sink in three mutually perpendicular planes.

The invention is carried out by providing a heat conducting member adjustably secured to a circuit board in thermal contact therewith having a portion slidably abutting the surface of a heat sink, that portion being readily biased into thermal contact with the surface of the heat sink.

The invention is further carried out by providing a T-shaped heat conducting member having its leg portion mounted flush with a circuit board and adjustably secured thereto in thermal contact therewith, a heat sink having a surface flush with the head portion of the T-shaped member and a device mounted on the heat sink for biasing the head of the T-shaped member into thermal contact with the surface of the heat sink and allowing slidable movement of the T-shaped member relative to the heat sink.

The above and other advantages will be made more apparent from the following specification taken in conjunction with the accompanying drawings wherein like reference numerals refer to like parts and wherein.

Figures 1, 2, 3, 4:
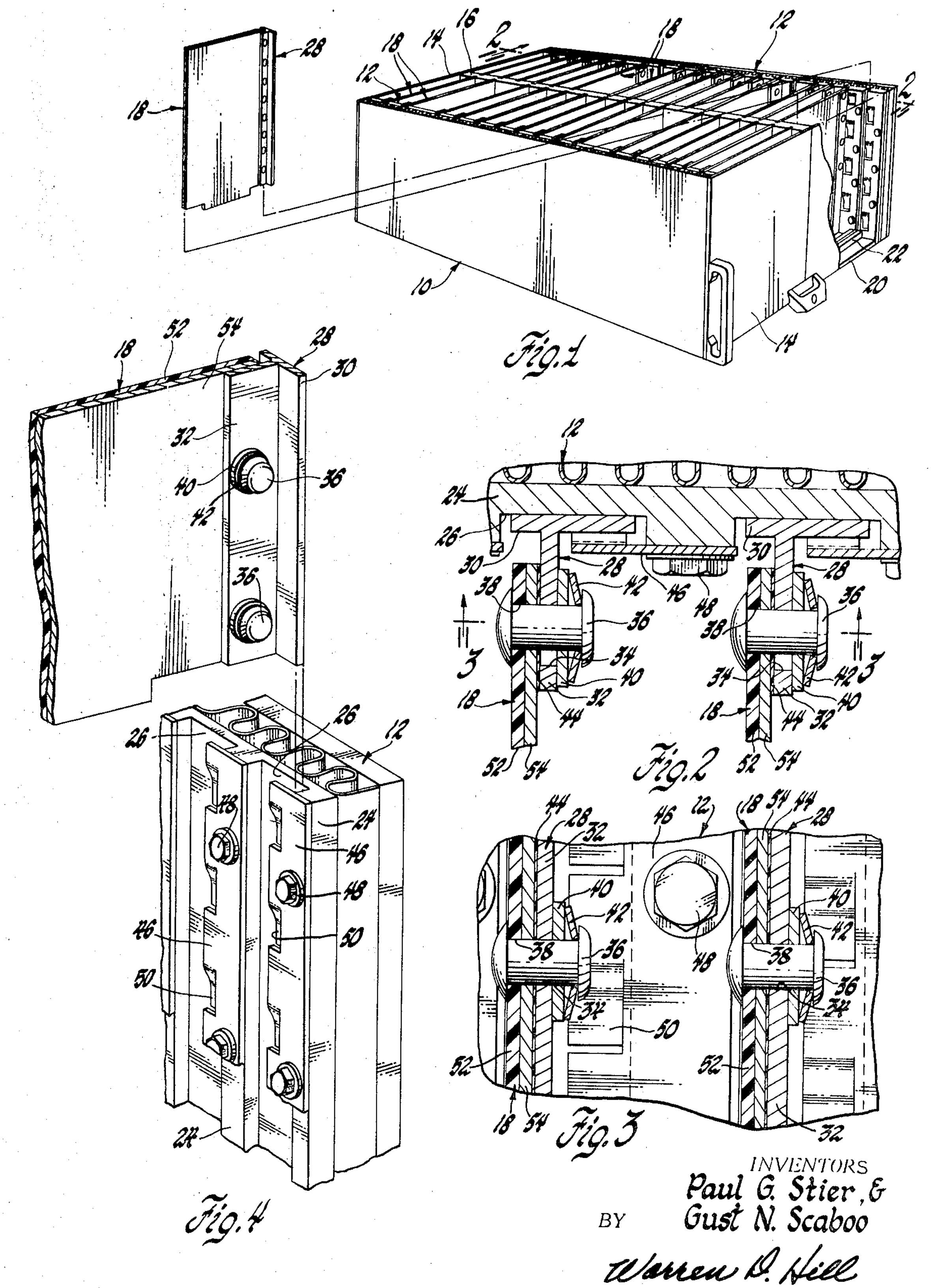
FIG. 1 is a perspective view of a cabinet carrying printed circuit boards and a heat exchanger thermally connected to the circuit boards in accordance with the invention.
FIG. 2 is a partial cross-sectional view of the circuit boards and heat sink and the thermal connector taken along lines 2–2 of FIG. 1.
FIG. 3 is an elevational view taken along lines 3–3 of FIG. 2.
FIG. 4 is a perspective view of portions of the heat sink, the circuit board and the thermal connector according to the invention.

FIG. 1 shows a drawer-type cabinet 10 having heat exchangers 12 comprising the sidewalls thereof and end panels 14 interconnecting the sidewalls. A slotted central divider 16 separates the cabinet 10 into two compartments each of which contains a array of printed circuits 18 slidably insertable into the cabinet 10. The bottom or base of the cabinet 10 includes a printed circuit board 20 carrying an electrical circuit making element connector 22 for each circuit board 18. Each connector element 22 is adapted to slidably receive a circuit board 18 and make contact with terminal portions of electrical conductors or circuit making connector elements (not shown) on the circuit boards 18. The circuit boards 18 are supported and secured within the cabinet 10 by the slotted central divider 16, by the electrical connectors 22 and by the heat exchangers 12.

As best shown in FIGS. 2, 3 and 4, each heat exhanger 12 has an inner wall 24 defining a series of vertical channels 26, one channel for each circuit board 18. An elongated T-shaped heat conducting member 28 comprises a head or flange 30 and a leg portion 32 perpendicular to the flange 30. The leg portion 32 includes a plurality of slots 34. The leg portion 32 of the T-shaped member 28 is secured at the edge of the circuit board 18 by a plurality of rivets 36 each passing through an aperture 38 in the circuit board 18, through a slot 34 in the leg portion 32, through a flat washer 40, and a spring washer 42. A coating of thermally conductive grease 44 between the circuit board 18 and the leg portion 32 helps insure a good thermal contact and aids sliding movement therebetween. The spring washer 42 also assists in assuring the thermal contact by urging the circuit board 18 and the leg portion 32 together, yet it limits the force therebetween to allow sliding movement between the circuit boards 18 and the leg portion 32 to the extent permitted by the slots 34. Thus the T-shaped member 28 is adjustably secured to the circuit board 18 and maintains a good thermal contact therewith.

The flange 30 of the T-shaped member 28 has a smaller width than the channel 26 in the wall 24 to allow room for lateral sliding movement of the flange 30 within the channel 26. Of course, longitudinal or vertical sliding movement of the flange 30 within the channel 26 is also permitted so that the circuit boards 18 can be inserted into the cabinet 10. The flange 30 of the T-shaped member 28 is retained within the channel 26 by an elongated spring clip 46 secured to the wall 24 by threaded fasteners 48. The spring clip 46 comprises a generally flat strip of spring metal having a plurality of resilient fingers 50 along one edge thereof and extending into the channel 26 to thereby engage the flange 30 of the T-shaped member 28 to bias the face of the flange 30 into good thermal contact with the bottom of the channel 26.

The printed circuit board 18 as depicted in the drawings includes a layer of insulating material 52 having circuit conductors and components not shown, secured to one side and having a sheet of metal foil 54 laminated to the other side. The metal foil 54 acts as a thermal plane to conduct heat from all portions of the circuit board 18 to the T-shaped member 28. It is not essential that the metal foil or thermal plane 54 be in contact with the heat conducting member 28. It is often desirable that the thermal plane 54 be sandwiched between two insulating circuit boards. For some applications, the thermal plane is omitted altogether, the heat conductive properties of the insulating circuit board being adequate to carry heat to the heat conducting member 28.

It has been found in actual use that the arrangement described herein is effective to conduct heat from the circuit board 18 to the heat sink 12 and is also effective to facilitate insertion of the circuit boards 18 into the cabinet 10 as well as help support each circuit board 18. When the circuit board 18 is plugged into the connector 22, the T-shaped heat conducting member 28 is self-adjusting in one direction relative to the circuit board 18 and in another lateral direction, perpendicular to the first, relative to the heat exchanger 12. It will be seen then that the construction according to the invention allows the circuit board 18 to be slidably inserted into the cabinet 10 and allows the circuit board 18 to be manipulated into proper registry with the connector 22 while maintaining good thermal communication between the circuit board 18 and the heat exchanger 12. This allows a substantial tolerance in the location of the connectors 22 on the circuit board 20 as well as in the dimensions of the circuit board 18 thereby minimizing fabrication costs and enhancing the interchangability of circuit boards.

The embodiment of the invention described herein is for purposes of illustration and the scope of the invention is intended to be limited only by the following claims:

We claim:

1. Means for conducting heat from a device carrying heat generating electrical components comprising:

a heat conducting member adjustably secured by a lost motion connection means in thermal engagement with the device carrying heat generating electrical components;

a heat sink having a surface disposed at an angle to the device;

a flange on the heat conducting member abutting the said surface and movable parallel to the surface;

and resilient means biasing the flange into intimate thermal contact with the surface;

whereby the heat conducting member forms a self-adjusting thermal connection between the device and the heat sink.

2. Means for conducting heat from a device carrying heat generating electrical components comprising:

an elongated heat conducting member adjustably secured by a lost motion connection means in thermal engagement with the device carrying heat generating electrical components;

a heat sink having a surface disposed perpendicular to the device;

a flange on the elongated heat conducting member abutting the said surface and movable in any direction parallel to the surface;

and resilient means biasing the flange into intimate thermal contact with the surface;

whereby the elongated member forms a self-adjusting thermal connection between the device and the heat sink.

3. Means for conducting heat from a printed circuit board comprising:

a heat conducting member having a leg portion and a flange portion, the leg portion being mounted flush with the printed circuit board and adjustably secured thereto by a lost motion connection means;

the lost motion connection means including resilient means for biasing the leg portion into intimate thermal contact with the printed circuit board;

a heat sink having a surface disposed at an angle to the printed circuit board and flush with the flange portion of the heat conducting member; and resilient means mounted on the heat sink and engaging the flange portion for biasing the flange portion into thermal contact with the said surface and allowing freedom of movement of the flange portion relative to said surface;

whereby the heat conducting member forms a self-adjusting thermal connection between the printed circuit board and the heat sink.

4. Means for conducting heat from a printed circuit board comprising:

a T-shaped heat conducting member having a leg portion and a flange portion, the leg portion being mounted flush with the printed circuit board and adjustably secured thereto by a lost motion connection means;

the lost motion connection means including resilient means for biasing the leg portion into intimate thermal contact with the printed circuit board;

a heat sink having a surface perpendicular to the printed circuit board and flush with the flange portion of the T-shaped member; and resilient means mounted on the heat sink and engaging the flange portion for biasing the flange portion into thermal contact with the said surface and allowing freedom of movement of the flange portion relative to said surface, whereby the T-shaped member forms a self-adjusting thermal connection between the printed circuit board and the heat sink.

5. Means for conducting heat from a printed circuit board comprising;

a T-shaped heat conducting member having a leg portion and a flange portion, the leg portion being mounted flush with the printed circuit board, the leg portion defining slotted apertures;

fastener means passing through the printed circuit board and through the slotted apertures for permitting slidable movement between the printed circuit board and the leg portion;

spring means mounted on the fastener means for urging the leg portion into thermal contact with the printed circuit board;

a heat exchanger having a wall perpendicular to the printed circuit board, a channel formed in the wall for slidably receiving the flange portion of the T-shaped member, the channel being wider than the flange portion to permit lateral movement of the flange portion; and an elongated spring clip secured to the wall and overhanging the channel for engaging the flange portion and urging the flange portion into thermal contact with the wall;

whereby the T-shaped member forms a self-adjusting thermal link between the printed circuit board and the heat exchanger.

6. In an electrical apparatus:

a plurality of circuit boards each having heat generating components and at least one side edge across which heat flows, and circuit-making connector elements located at another edge substantially normal to said side edge;

a housing including a base having circuit-making connector elements mating with the connector elements of said circuit boards, respectively, the location of the connector elements of the circuit boards and the housing being subject to tolerances that variably position the circuit boards both in their respective planes and in the direction normal thereto, the housing further having a sidewall of material having good heat conductivity, the sidewall having an inwardly facing surface; and elements of material having good heat conductivity affixed in good heat conducting relation to the circuit boards at said side edges respectively said elements having faces complementary to and adapted to seat upon said surface in heat-conducting contact, the said faces of said elements being movable relative to said surface in the direction normal to the planes of the circuit boards by an amount sufficient to accommodate the tolerances of the connector elements in said direction, said elements further being affixed to the said edges of said circuit boards in a fashion permitting movement relative to their respective circuit boards in the plane of each circuit board to an extent sufficient to provide snug engagement of said faces with said surface over the tolerance range of said connector elements in the direction of the planes of the circuit boards.

7. In an electrical apparatus:

a plurality of plane circuit boards each having heat generating components and at least one side edge across which heat flows, and circuit-making connector elements located at another edge substantially normal to said side edge;

a housing including a base having circuit-making connector elements mating with the connector elements of said circuit boards, respectively, the location of the connector elements of the circuit boards and the housing being subject to tolerances that variably position the circuit boards both in their respective planes and in the direction normal thereto, the housing further having a sidewall of material having good heat conductivity, the sidewall having inwardly facing channels corresponding to the circuit boards, respectively, the channels forming faces having substantially the lengths of the first-mentioned edges of the circuit boards, respectively, and being of extent normal to the planes of the circuit boards substantially greater than the corresponding dimension of the circuit boards; and elements of material having good heat conductivity affixed in good heat conducting relation to the circuit boards at said side edges respectively, said elements being of substantially the lengths of said edges, respectively, and having faces complementary to and adapted to seat upon the faces of said channels, respectively, in gap-free heat-conducting contact, the extent of said faces of said elements being less than the extent of the faces of the channels in the direction normal to the planes of the circuit boards by an amount sufficient to accommodate the tolerances of the connector elements in said direction, said elements further being affixed to the said edges of said circuit boards in a fashion permitting movement relative to their respective circuit boards in the plane of each circuit board to an extent sufficient to provide snug gap-free engagement of said faces over the tolerance range of said connector elements in the direction of the planes of the circuit boards.